United States Patent
Fenchel et al.

(10) Patent No.: US 10,310,041 B2
(45) Date of Patent: Jun. 4, 2019

(54) METHOD AND MAGNETIC RESONANCE APPARATUS FOR AUTOMATIC ASSIGNMENT OF A SPIN SPECIES TO A COMBINATION IMAGE

(71) Applicant: Siemens Healthcare GmbH, Erlangen (DE)

(72) Inventors: Matthias Fenchel, Erlangen (DE); Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 293 days.

(21) Appl. No.: 15/272,724

(22) Filed: Sep. 22, 2016

(65) Prior Publication Data
US 2017/0082713 A1 Mar. 23, 2017

(30) Foreign Application Priority Data
Sep. 22, 2015 (DE) .................. 10 2015 218 168

(51) Int. Cl.
*G01V 3/00* (2006.01)
*G01R 33/56* (2006.01)
(Continued)

(52) U.S. Cl.
CPC ..... *G01R 33/5608* (2013.01); *G01R 33/4828* (2013.01); *G06N 20/00* (2019.01)

(58) Field of Classification Search
USPC ......................................... 324/309
See application file for complete search history.

(56) References Cited

U.S. PATENT DOCUMENTS

| 5,594,336 A * | 1/1997 | Gullapalli | ......... G01R 33/4828 324/309 |
| 6,841,997 B2 * | 1/2005 | Feiweier | ............ G01R 33/4828 324/307 |

(Continued)

FOREIGN PATENT DOCUMENTS

EP 2610632 A1 7/2013

OTHER PUBLICATIONS

Chang et al., "LIBSVM—A Library for Support Vector Machines," http://www.csie.ntu.edu.tw/~cjlin/libsvm/.
(Continued)

*Primary Examiner* — Rodney E Fuller
(74) *Attorney, Agent, or Firm* — Schiff Hardin LLP

(57) ABSTRACT

In a method and apparatus for the automatic assignment of at least one combination image of an examination object to a spin species represented in the combination image, relationships, which were determined from an existing database and which relate to the assignment of spin species to combination images, are loaded into a computer. At least two MR datasets at one of at least two echo times in each case following an excitation by means of a multi-contrast measurement are supplied to the computer. At least one combination image is determined in the computer from the at least two MR datasets. The spin species represented in the at least one combination image are assigned in the computer on the basis of the loaded relationships. By using relationships determined from an existing database, an automatic unambiguous global assignment of the correct spin species is enabled.

11 Claims, 2 Drawing Sheets

(51) Int. Cl.
*G06N 20/00* (2019.01)
*G01R 33/48* (2006.01)

(56) References Cited

U.S. PATENT DOCUMENTS

| | | | | |
|---|---|---|---|---|
| 7,619,411 | B2* | 11/2009 | Reeder | G01R 33/4824 324/309 |
| 2005/0033151 | A1* | 2/2005 | Wu | G01R 33/50 600/410 |
| 2005/0165296 | A1 | 7/2005 | Ma | |
| 2012/0224757 | A1* | 9/2012 | Gross | G01R 33/56563 382/131 |
| 2014/0350386 | A1* | 11/2014 | Eggers | G01R 33/4828 600/416 |
| 2015/0309138 | A1* | 10/2015 | Lee | G01R 33/58 324/310 |
| 2016/0161584 | A1 | 6/2016 | Fautz et al. | |
| 2017/0035321 | A1* | 2/2017 | Polimeni | G01R 33/50 |
| 2017/0082712 | A1* | 3/2017 | Kannengiesser | G01R 33/4828 |
| 2017/0350951 | A1* | 12/2017 | Samsonov | G01R 33/485 |

OTHER PUBLICATIONS

"Haar-like features," From Wikipedia, the free encyclopedia, http://en.wikipedia.org/wiki/Haar-like_features.

"Support vector machine," From Wikipedia, the free encyclopedia, http://en.wikipedia.org/wiki/Support_vector_machine.

Hernando et al., "Chemical Shift-Based Water/Fat Separation: A Comparison of Signal Models," Magnetic Resonance in Medicine, vol. 64, pp. 811-822 (2010).

Yeung et al., "Separation of True Fat and Water Images by Correcting Magnetic Field Inhomogeneity in Situ," Radiology, vol. 159, pp. 783-786 (1986).

Kanayama et al., "Ultrafast Single-Shot Water and Fat Separated Imaging with Magnetic Field Inhomogeneities," IEICE Trans. Inf. & Syst., vol. E77-D, pp. 918-924 (1994).

* cited by examiner

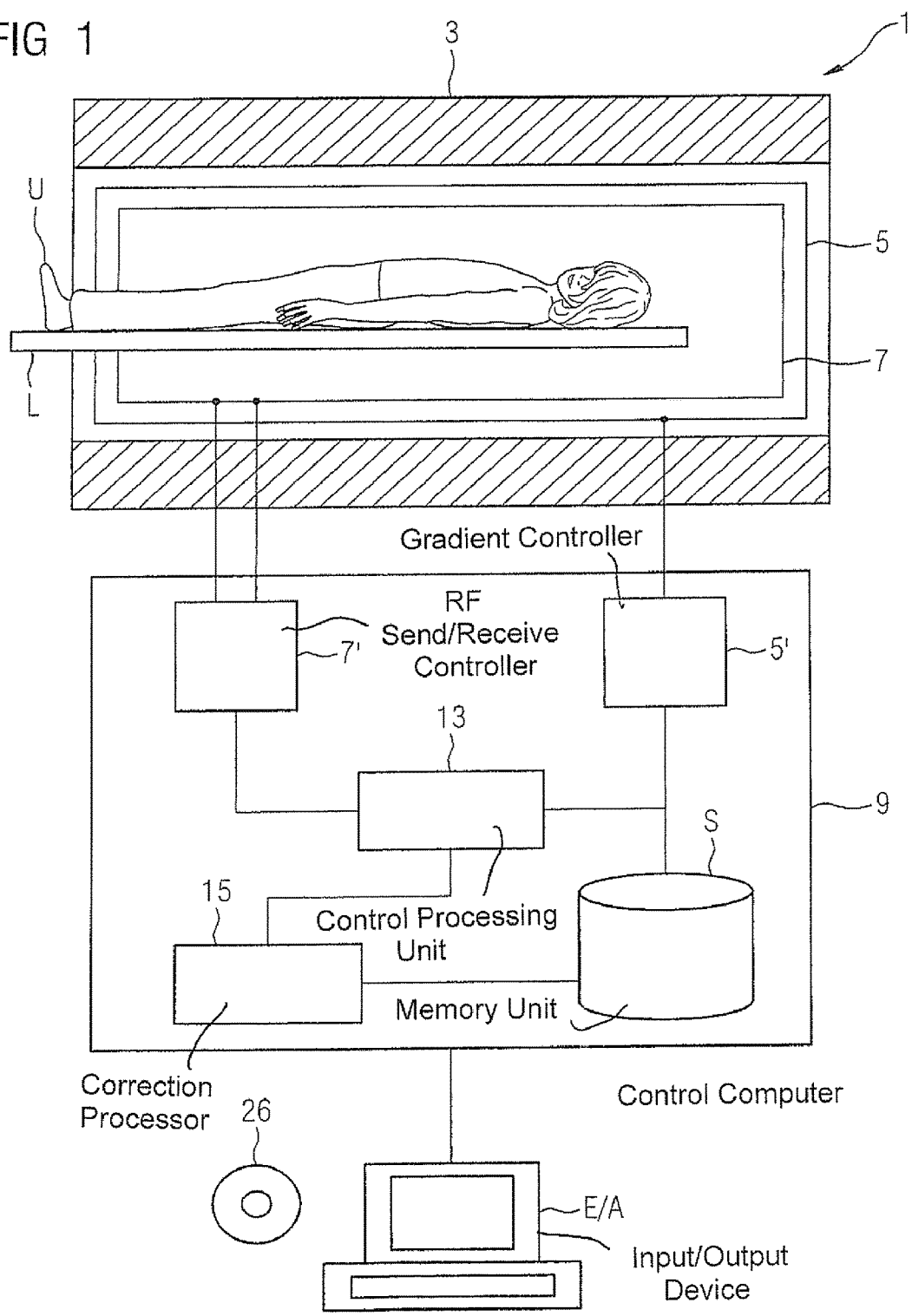

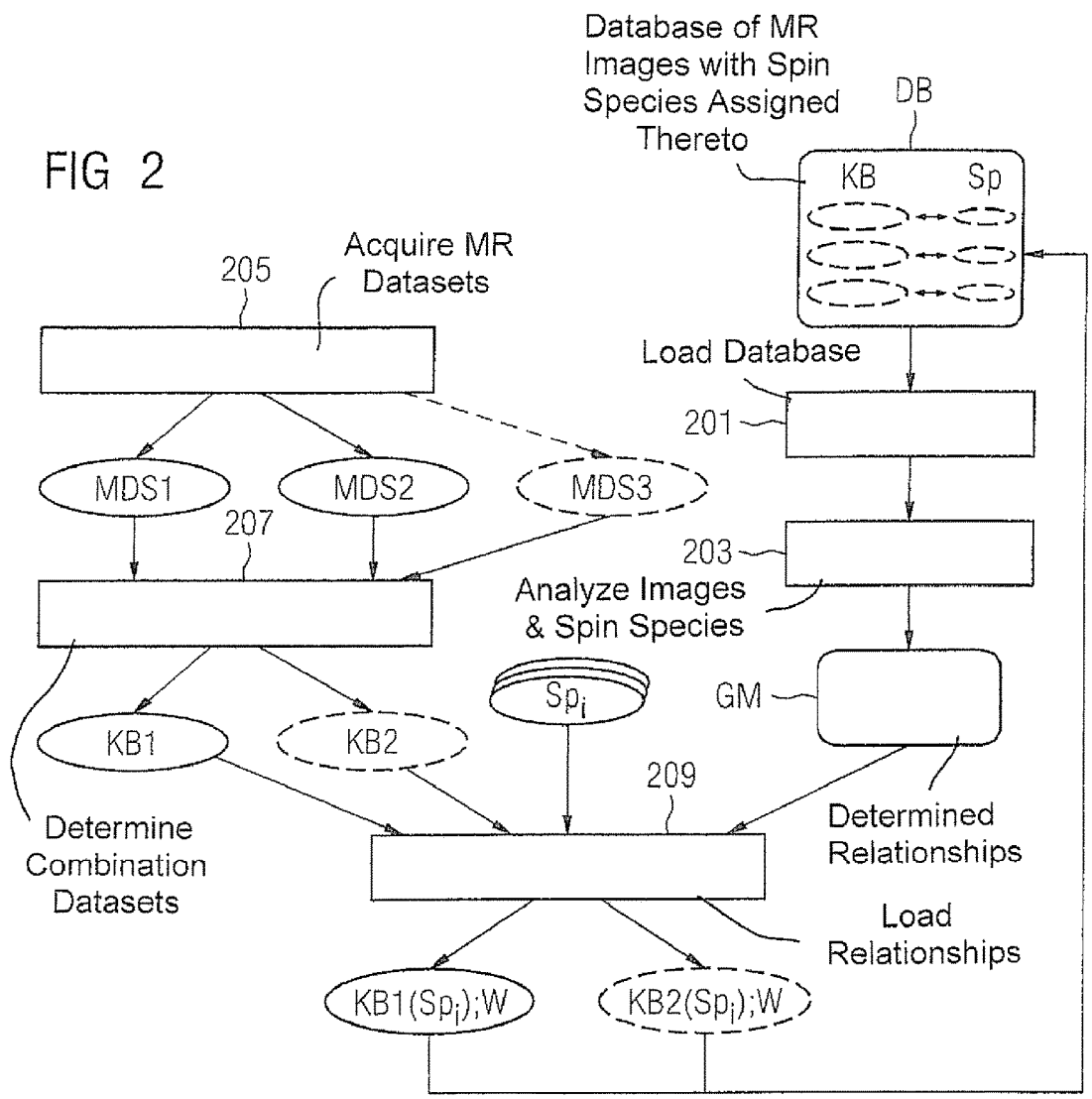

METHOD AND MAGNETIC RESONANCE APPARATUS FOR AUTOMATIC ASSIGNMENT OF A SPIN SPECIES TO A COMBINATION IMAGE

BACKGROUND OF THE INVENTION

Field of the Invention

The invention concerns a method, a magnetic resonance apparatus and an electronically readable data carrier for the automatic assignment of a spin species to a combination image that was obtained from at least two magnetic resonance datasets of a multi-contrast measurement.

Description of the Prior Art

Magnetic resonance (MR) technology is a known modality that can be used to generate images of the inside of an examination object. In simple terms, the examination object is positioned in a magnetic resonance scanner in a strong, static, homogeneous, constant magnetic field, also called a Bo field, with field strengths of normally 0.2 Tesla to 7 Tesla and more, such that nuclear spins in the object are oriented along the constant magnetic field. To trigger nuclear spin resonances, radio-frequency excitation pulses (RF pulses) are radiated into the examination object. The triggered nuclear spin resonances are measured as so-called k-space data, and on the basis thereof MR images are reconstructed or spectroscopy data are determined. For spatial encoding of the measurement data, rapidly switched magnetic gradient fields are overlaid on the constant magnetic field. The recorded measurement data are digitized and stored in the form of complex numeric values in a k-space matrix. An associated MR image can be reconstructed from the value-filled k-space matrix, for example by a multidimensional Fourier transform.

Various MR techniques are known for separating signals from different spin species, for example spin in a water environment and spin in a fat tissue environment, as well as other environments, into recorded MR data or for suppressing the signals from particular spin species. These techniques include so-called multi-contrast measurements. One such technique is the Dixon technique, in which at least two MR datasets are recorded at different echo times in each case following an excitation, and are therefore recorded with different contrasts. In this case the echo times are selected such that the relative phase position of different spin species of the signals contained in an MR dataset is different in the various recorded MR datasets. With knowledge of the respective phase positions it is possible to extract combination images from the recorded MR datasets reconstructed MR datasets, which for example represent signals from only one spin species.

In principle a Dixon technique can be implemented using different sequence types, for example with (turbo) spin echo sequences, SSFP sequences (SSFP: "steady-state free precession") or gradient echo sequences, and it therefore has a wide range of applications.

To determine a combination image the reconstructed MR images are generally set off against one another pixel by pixel. In order to eliminate unknown phase portions, the absolute signal portions of the pixels are taken into consideration, which means the results are not unambiguous if a subtraction takes place, since $$|S| = \begin{cases} Sp1 - Sp2; & Sp1 > Sp2 \\ Sp2 - Sp1; & Sp2 > Sp1 \end{cases},$$

wherein S represents the value of the signal and $Sp1$ and $Sp2$ represent the signal components of two different spin species, e.g. water and fatty tissue. All that can be stated is which combination image represents the dominant spin species, namely the one which is determined by an addition of signals from the at least two captured MR datasets, and which combination image represents the subordinate spin species, namely the one which is determined by subtracting signals from the at least two captured MR datasets. The most frequent application of a Dixon technique is water/fat separation, in which a water image and/or a fat image is to be determined as a combination image.

Although the result of a Dixon technique is therefore the combination images referred to, which represent signals from only one spin species, it is not however readily apparent which combination image obtained is to be assigned to which spin species. When a fat/water separation is desired, it is not therefore possible to say which of the determined combination images is the fat image and which the water image. The correct assignment still has to be selected first.

If the derived combination images are determined by optimization, in which there may be several local minima, an ambiguity of this type likewise exists. This is because although all the minima are known, it is still not possible to know which one is the one sought (in the simplest case the values of the optimization function are identical for all minima—the minima are thus degraded). However, the minima can, as described, be characterized e.g. by the dominant species. The same applies if the combination images are determined as a result of phase unwrapping with different start points. In each case the correct assignment is initially still unknown.

If several Dixon recordings are taken, so that several sets of MR images of just one spin species are obtained, it can happen that the assignment has taken place differently in the different sets, which means MR images from different sets, which in fact represent the same spin species, are assigned to different spin species.

SUMMARY OF THE INVENTION

An object of the invention is to enable an unambiguous assignment of combination images obtained by means of a multi-contrast measurement to the correct spin species in each case.

The inventive method for the automatic assignment of at least one combination image of an examination object to a spin species represented in the combination image has the following steps.

Relationships determined from existing databases, and which relate to the assignment of spin species to combination images, are loaded into a computer.

At least two MR datasets are acquired at one of at least two echo times in each case following an excitation by a multi-contrast measurement.

At least one combination image is determined in the computer from the at least two MR datasets.

The spin species represented in the at least one combination image is determined in the computer on the basis of the relationships that were loaded.

By using relationships automatically determined from existing databases the method enables an automatic unambiguous global assignment of the correct spin species.

An inventive method for determining relationships during the assignment of spin species to a combination image determined on the basis of at least two MR datasets captured at different echo times of a multi-contrast sequence, only one spin species being represented in said combination image, has the following steps.

A database composed of multiple pairs of previously assigned combination images with an associated spin species is loaded in a computer.

The parameters of the combination images, and of the assigned spin species, are analyzed in the computer and based on the analysis performed, relationships of the assignment by generalization are automatically determined in the computer.

The created relationships are provided for further use in the computer during an assignment of a spin species to a combination image that is not part of the database.

The inventive magnetic resonance system has a data acquisition scanner operated by a control computer designed to perform an inventive method.

An inventive non-transitory electronically readable data carrier (storage medium) has electronically readable control code stored thereon that, when executed by a control computer of a magnetic resonance apparatus, causes the control computer to perform an inventive method.

The advantages and details described with regard to the method for assignment also apply to the method for determining the relationships, the magnetic resonance system, the computer program and the electronically readable data carrier.

BRIEF DESCRIPTION OF THE DRAWINGS

FIG. 1 schematically illustrates an inventive magnetic resonance apparatus.

FIG. 2 is a flowchart of the inventive methods.

DESCRIPTION OF THE PREFERRED EMBODIMENTS

FIG. 1 schematically shows an inventive magnetic resonance system that has a magnetic resonance scanner with a basic field magnet 3 for generating a constant magnetic field, a gradient arrangement 5 for generating gradient fields, a radio frequency antenna 7 for radiation of and receiving radio frequency signals, and a control computer 9 designed for the performance of an inventive method. FIG. 1 schematically represents these subassemblies of the magnetic resonance system 1 only at a high level. For example, the radio frequency antenna 7 can be composed of several subunits, in particular several coils, which can be designed either to only transmit radio frequency signals or to only receive the triggered radio frequency signals, or for both.

To examine an examination object U, for example a patient or a phantom, the examination object U can be introduced on a couch L into the scanner 2 into the measurement volume thereof.

The control computer 9 is used to control the magnetic resonance system and can in particular control the gradient arrangement 5 by a gradient controller 5' and the radio frequency unit 7 by a radio frequency transmit/receive controller 7'. The control computer 9 further has an information determination processor 15 and is designed to perform an inventive method for the automatic assignment of at least one combination image of an examination object to a spin species represented in the combination image (see FIG. 2). A central processing unit 13 of the control computer 9 is designed to execute all processing operations needed for the requisite measurements and determinations. Interim results and results required for this purpose or determined in this connection can be stored in a memory S of the control computer 9. The components illustrated are not necessarily physically separate units, but merely represent a subcategorization into coherent units, which can also be implemented e.g. in a few or in just one single physical unit.

Via an input/output device E/A of the magnetic resonance system 1 it is possible for e.g. a user to route control commands to the magnetic resonance system and/or to display results of the control computer 9 such as e.g. image data or the particular dephasing factors.

The methods described herein can also exist individually or separately in the form of a computer code that causes the respective method to be performed by the control computer 9 when the code is executed in the control computer 9. An electronically readable data carrier 26 with electronically readable control information stored thereon can be provided.

FIG. 2 is a flowchart that illustrates the inventive method for the automatic assignment of at least one combination image of an examination object to a spin species represented in the combination image and for determining relationships during the assignment of spin species to a combination image.

In a step 201 a database DS is loaded that has multiple pairs of previously assigned combination images KB with the associated correctly assigned spin species Sp.

The combination images KB have here been determined on the basis of at least two MR datasets captured at different echo times of a multi-contrast sequence, in particular in the context of a Dixon measurement.

The combination images KB in the loaded database and their associated spin species Sp are analyzed in accordance with their parameters in a further step 203 and on the basis of the analysis performed relationships GM are automatically created which represent rules for the correct assignment. To this end interrelationships, in particular those found during the analysis, between parameters of the combination images KB and the respective correctly assigned spin species Sp are generalized.

The relationships GM created are finally supplied for further use during an assignment of a spin species $SP_i$ to a combination image KB1, KB2 which is not part of the database DB. To this end the relationships GM can for example be retrievably stored in a memory.

The parameters that are taken into consideration during the analysis of the correctly assigned pairs of combination images KB and spin species Sp can in be the examination objects represented in the respective combination images of the databases, for example the organ or anatomy represented, and/or the recording techniques used during the determination of the combination images KB, the type of multi-contrast measurement, and in particular the sequence types used.

The parameters taken into consideration for the determination of the relationships GM can also be derived variables. In particular, histogram properties of the combination images KB, such as e.g. average value of the signal strength, standard deviation or median, extreme values, etc., or correlations or other norms of the combination images, such as e.g. a Fourier decomposition or a wavelet decomposition, can be taken from the database DB as parameters. The parameters can in particular be compared between the different combination images KB, the respectively assigned spin species Sp being taken into consideration.

The parameters can therefore be direct information about the combination images KB contained in the database DB, such as e.g. pixel values of the combination images KB, as well as derived local information, such as e.g. linear combinations of pixel values of the combination images KB (such as Haar-like local features) or global variables derived from the combination images KB, such as the aforementioned histogram properties, etc.

The relationships GM can in particular be determined using methods and algorithms which are known from so-called machine learning. This type of machine learning is generally based on a so-called feature vector, which can contain the corresponding parameters, on the basis of which the algorithm is trained.

Furthermore, in a step 205 at least two MR datasets MDS1, MDS2, MDS3 are captured at one of the at least two echo times in each case following an excitation, by means of a multi-contrast measurement using the magnetic resonance system.

Such a multi-contrast measurement can be a Dixon measurement. If only two MR datasets MDS1, MDS2 are captured, in particular a two-point Dixon measurement. However, multi-point Dixon measurements are also conceivable for the inventive method, such as e.g. a three-point Dixon measurement. Accordingly more than only two sets of MR datasets MDS1, MDS2, MDS3 are captured, which are recorded at the respective more than only two echo times of the multi-point Dixon measurement.

At least one combination image KB1 is determined from the captured MR datasets MDS1, MDS2, MDS3 in one step. The procedure here can be in accordance with the standard methods for separation of signals of the various spin species, as was already mentioned in the introduction. Depending on the characteristics of the examination object and the desired combination image, two or more combination images KB1, KB2, . . . can also be determined. For example, in an examination object with more than two different spin species $Sp_i$ (i=1, 2, 3, . . . ), such as water, fat and silicone, a combination image $KB_i$ can be determined for each spin species $Sp_i$. However—as described above—it is not immediately apparent which combination image KB1, KB2, . . . should be assigned to which spin species.

In a step 209 relationships GM determined from existing databases DB are loaded, and relate to the assignment of spin species $SP_i$ to combination images, and the spin species $Sp_i$ which is actually represented in the combination image KB1, KB2 is automatically assigned to the at least one combination image KB1, KB2 on the basis of the loaded relationships GM I, so that it is known that the combination image KB1 for example represents the spin species $Sp_i$ (KB1($Sp_i$)). If more than one combination image KB1, KB2 was determined, this assignment can be made on the basis of the information I for each combination image KB1, KB2 determined from the information MR dataset IDS (KB1 ($Sp_i$), KB2($Sp_i$)).

The assignment is based on the loaded relationships GM. The loaded relationships for example comprise a consideration of the examination objects represented in the databases and/or a consideration of the recording techniques used in the databases, in particular the sequence types used.

A consideration of the examination objects represented, in particular the anatomy and/or organ represented, readily permits conclusions to be drawn about the spin species likely to be dominant in which region. A consideration of the recording technique used permits a better classification of the existing signal strengths and contrasts and thus can be helpful for the correct assignment of the spin species.

The assignments made can furthermore be stored e.g. in the memory S of the control computer 9 of the magnetic resonance system or in any other memory. The assigned combination images KB1, KB2 can be displayed on a display unit indicating the represented, assigned spin species.

In an exemplary embodiment of the method the existing database DB can be supplemented, following the assignment of the spin species $Sp_i$ to the at least one combination image KB1, KB2, by the thereby newly obtained data KB1($Sp_i$), KB2($Sp_i$). In this way the database is always expanded and potentially more precise relationships GM can be created afresh on this larger database.

Depending on the size and quality of the database DB, the relationships GM created on the basis thereof are potentially still not totally reliable. Hence it may be that the assignment made of a spin species $SP_i$ to a combination image KB1, KB2 is subject to a probability of success W. This probability of success W depends on the quality and size of the database and the algorithms used during the creation of the relationships GM and the parameters considered and can be estimated accordingly. Known algorithms of so-called machine learning are in particular suitable as algorithms here.

It may furthermore be expedient to display to the user of the method the probability of success W applicable to the result of the assignment (KB1 ($Sp_i$), KB2($Sp_i$)). If applicable, if the probability of success is not sufficiently high, the user can then apply further methods for assigning the spin species, in particular by himself checking whether the assignment (KB1($Sp_i$), KB2($Sp_i$)) is correct, and if not changing the result (not shown).

In particular spin species from the group comprising water protons, fat protons and silicone protons are suitable as globally assigned spin species $Sp_i$. The possible spin species $Sp_i$ are known beforehand, e.g. from the nature of the examination object.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for automatic assignment of at least one magnetic resonance combination image of an examination subject to a magnetic resonance spin species represented in the combination image, comprising:
   loading predetermined relationships, determined from existing databases, into a computer that define assignment of magnetic resonance spin species to magnetic resonance combination images;
   operating a magnetic resonance data acquisition scanner to execute a multi-contrast magnetic resonance data acquisition measurement in which at least two echo times are produced, and acquiring at least two magnetic resonance datasets respectively during said at least two echo times;
   providing said magnetic resonance datasets to said computer and reconstructing at least one combination image from said at least two magnetic resonance datasets;
   in said computer, using the loaded relationships to assign spin species represented in said determined at least one combination image to respective magnetic resonance spin species; and
   making an electronic signal representing the assignment of the respective magnetic resonance spin species available from the computer in electronic form.

2. A method as claimed in claim 1 comprising supplementing said existing database with said determined assignment of the respective spin species in the determined at least one combination image, thereby obtaining a supplemented database, and making the supplemented database available for a subsequent automatic assignment of respective magnetic resonance spin species in said computer.

3. A method as claimed in claim 1 comprising, in said computer, defining a probability that the determined assignment of the respective magnetic resonance spin species to said reconstructed combination image is correct.

4. A method as claimed in claim 3 comprising presenting a visual representation of said probability at a display screen in communication with said computer.

5. A method for determining relationships of respective magnetic resonance spin species to each other for assigning a respective magnetic resonance spin species to a magnetic resonance combination image reconstructed from at least two magnetic resonance datasets acquired respectively at different echo times of a multi-contrast magnetic resonance data acquisition sequence, wherein only one spin species is represented in said reconstructed combination image, said method comprising:

loading a database into a computer that comprises stored designations of a plurality of pairs of previously assigned reconstructed magnetic resonance combination images with an associated magnetic resonance spin species;

in said computer automatically analyzing parameters of the reconstructed combination images in said database and the respective magnetic resonance spin species assigned thereto in order to obtain an analysis result and, from said analysis result, automatically determining generalized relationships that designate said assignment; and making the determined relationships available from the computer in electronic form for subsequent use during assignment of a magnetic resonance spin species to a reconstructed magnetic resonance combination image, which is not included in said database.

6. A method as claimed in claim 5 wherein said parameters are selected from the group consisting of parameters designating information about an examination object represented in the respective reconstructed combination images in the database, parameters in data acquisition techniques used for acquiring the data that is reconstructed in the reconstructed combination images of the database, parameters designating a sequence type of a data acquisition sequence used for acquiring the magnetic resonance data reconstructed in the reconstructed combination images of the database, parameters designating information read directly from the reconstructed combination images of the database, parameters representing local information derived from the reconstructed combination images of the database, and parameters representing global information derived from the reconstructed combination images of the database.

7. A method as claimed in claim 5 comprising determining said relationships in said computer using a machine learning algorithm.

8. A magnetic resonance apparatus comprising:

a computer loaded with predetermined relationships, determined from existing databases, into a computer that define assignment of magnetic resonance spin species to magnetic resonance combination images;

a magnetic resonance data acquisition scanner configured to execute a multi-contrast magnetic resonance data acquisition measurement in which at least two echo times are produced, and to acquire at least two magnetic resonance datasets respectively during said at least two echo times;

said computer being provided with said magnetic resonance datasets, and said computer being configured to reconstruct at least one combination image from said at least two magnetic resonance datasets;

said computer being configured to use the loaded relationships to assign spin species represented in said determined at least one combination image to respective magnetic resonance spin species; and said computer being configured to make an electronic signal representing the assignment of the respective magnetic resonance spin species available from the computer in electronic form.

9. A computer comprising:

a memory;

an input interface in communication with said memory, via which stored designations of a plurality of pairs of previously assigned reconstructed magnetic resonance combination images with an associated magnetic resonance spin species are loaded into the memory;

a processor configured to automatically analyze parameters of the reconstructed combination images in said memory and the respective magnetic resonance spin species assigned thereto in order to obtain an analysis result and, from said analysis result, automatically determine generalized relationships that designate said assignment;

an output interface; and said processor being configured to make the determined relationships available from the processor in electronic form via said output interface for subsequent use during assignment of a magnetic resonance spin species to a reconstructed magnetic resonance combination image, which is not included in said memory.

10. A non-transitory, computer-readable data storage medium encoded with programming instructions, said storage medium being loaded into a control and evaluation computer of a magnetic resonance apparatus that comprises a magnetic resonance data acquisition scanner, and said programming instructions causing said control and evaluation computer to:

receive predetermined relationships, determined from existing databases that define assignment of magnetic resonance spin species to magnetic resonance combination images;

operate a magnetic resonance data acquisition scanner to execute a multi-contrast magnetic resonance data acquisition measurement in which at least two echo times are produced, and acquiring at least two magnetic resonance datasets respectively during said at least two echo times;

reconstruct at least one combination image from said at least two magnetic resonance datasets;

use the loaded relationships to assign spin species represented in said determined at least one combination image to respective magnetic resonance spin species; and make an electronic signal representing the assignment of the respective magnetic resonance spin species available from the control and evaluation computer in electronic form.

11. A non-transitory, computer-readable data storage medium encoded with programming instructions, said storage medium being loaded into a control and evaluation computer of a magnetic resonance apparatus that comprises a magnetic resonance data acquisition scanner, and said programming instructions causing said control and evaluation computer to:
- receive a database that comprises stored designations of a plurality of pairs of previously assigned reconstructed magnetic resonance combination images with an associated magnetic resonance spin species;
- automatically analyze parameters of the reconstructed combination images in said database and the respective magnetic resonance spin species assigned thereto in order to obtain an analysis result and, from said analysis result, automatically determining generalized relationships that designate said assignment; and
- make the determined relationships available from the control and evaluation computer in electronic form for subsequent use during assignment of a magnetic resonance spin species to a reconstructed magnetic resonance combination image, which is not included in said database.

* * * * *